United States Patent [19]

Druschel et al.

[11] Patent Number: 4,632,294

[45] Date of Patent: Dec. 30, 1986

[54] PROCESS AND APPARATUS FOR INDIVIDUAL PIN REPAIR IN A DENSE ARRAY OF CONNECTOR PINS OF AN ELECTRONIC PACKAGING STRUCTURE

[75] Inventors: William O. Druschel, Granite Springs; Alexander Kostenko, Hopewell Junction; Rolf G. Meinert, Wappingers Falls, all of N.Y.

[73] Assignee: International Business Machines Corporation, Armonk, N.Y.

[21] Appl. No.: 684,823

[22] Filed: Dec. 20, 1984

[51] Int. Cl.$^4$ .................................................. B23K 31/00

[52] U.S. Cl. ........................................ 228/119; 228/264

[58] Field of Search ..................... 228/19, 20, 21, 119, 228/264, 240, 242, 180.1, 180.2; 294/65.5

[56] References Cited

U.S. PATENT DOCUMENTS

| | | | |
|---|---|---|---|
| 3,283,124 | 11/1966 | Kawecki | 219/347 |
| 3,374,531 | 3/1968 | Bruce | 29/498 |
| 3,429,040 | 2/1969 | Miller | 29/626 |
| 3,469,061 | 9/1969 | Costello | 219/85 |
| 3,517,278 | 6/1970 | Hager | 317/234 |
| 3,586,813 | 6/1971 | Cruickshank | 219/85 |
| 3,653,572 | 4/1972 | Dushkes | 228/20 |
| 3,710,069 | 1/1973 | Papadopoulos | 219/85 |
| 3,735,911 | 5/1973 | Ward | 228/19 |
| 3,751,799 | 8/1973 | Reynolds | 29/574 |
| 3,895,214 | 7/1975 | Winter | 228/19 |
| 3,993,123 | 11/1976 | Chu | 165/80 |
| 4,066,204 | 1/1978 | Wirbser | 228/264 |
| 4,138,692 | 2/1979 | Meeker | 357/76 |
| 4,160,893 | 7/1979 | Meyen | 219/85 |
| 4,245,273 | 1/1981 | Feinberg | 361/382 |
| 4,270,260 | 6/1981 | Krueger | 29/403 |
| 4,295,596 | 10/1981 | Doten et al. | 228/264 |
| 4,302,625 | 11/1981 | Hetherington | 174/68 |
| 4,366,925 | 1/1983 | Janene | 228/20 |
| 4,418,857 | 12/1983 | Ainslie et al. | 228/180.2 |
| 4,444,559 | 4/1984 | Schink | 432/226 |

FOREIGN PATENT DOCUMENTS

| | | | |
|---|---|---|---|
| 2910066 | 9/1980 | Fed. Rep. of Germany | 228/242 |
| 2925347 | 1/1981 | Fed. Rep. of Germany | 228/264 |
| 918090 | 4/1982 | U.S.S.R. | 294/65.5 |

OTHER PUBLICATIONS

"Extraction Tool", by A. W. Northrop & S. J. Yevchak, IBM Technical Disclosure Bulletin Publication, vol. 3, No. 5, Oct. 1960, p. 8.

"Chip Removal by Hot Gas", by C. R. Tickner, IBM Technical Disclosure Bulletin Publication, vol. 11, No. 7, Dec. 1968, p. 875.

"Circuit Board Module Replacement Tool", by A. S. Baweja & H. P. Carl, IBM Technical Disclosure Bulletin Publication, vol. 13, No. 7, Dec. 1970, p. 2107.

"Pinning Technique for Ceramic Module", by J. R. Lynch, IBM Technical Disclosure Bulletin Publication, vol. 14, No. 1, Jun. 1971, p. 174.

"Integrated Circuit Device Recovery and Restoration Technique", by P. A. Totta, IBM Technical Disclosure Bulletin Publication, vol. 17, No. 1, Jun. 1974, p. 113.

"Low-Temperature Soldered Component Removal", by W. C. Ward, IBM Technical Disclosure Bulletin Publication, vol. 19, No. 7, Dec. 1976, p. 2476.

"Use of a Heated Gas Jet to Remove a Silicon Chip Soldered to a Substrate", by K. S. Sachar & T. A. Sedgwick, IBM Technical Disclosure Bulletin Publication, vol. 20, No. 9, Feb. 1978, p. 3725.

"Inverted Hot Gas Selected Chip Removal", by L. R. Cutting & R. E. Darrow, IBM Technical Disclosure Bulletin Publication, vol. 21, No. 9, Feb. 1979, p. 3592.

"Pin Repair Reflow Capillary", by J. J. Dankelman, H. R. Poweleit, R. J. Seeger and C. G. Smith, IBM Technical Disclosure Bulletin Publication, vol. 22, No. 2, Jul. 1979, p. 565.

"Psuedo-Brewster Angle of Incidence for Joining or Removing a Chip by Laser Beam", by J. C. Chastang, M. Levanoni & S. I. Tan, IBM Technical Disclosure Bulletin Publication, vol. 23, No. 11, Apr. 1981, p. 5194.

Primary Examiner—M. Jordan
Attorney, Agent, or Firm—Wesley DeBruin

[57] ABSTRACT

The disclosure is directed to process and apparatus for the removal, site preparation, and replacement of any single connector pin contained within a sizeable array of closely spaced very small connector pins on an electronic packaging structure (substrate or module) without causing deleterious metallurgical effects either to the remaining pins or the ceramic substrate.

11 Claims, 19 Drawing Figures

PROGRAMMED TIME / TEMP CURVE

PROCESS PARAMETERS:

REGION A = 6.0 TO 6.5 °C SEC
REGION B = 3.5 TO 4.0 °C SEC
REGION C < 50 °C / SEC FIRST 3 SEC
VOLTAGE : 46.2 ± 0.2 VDC
N2 FLOW : 16.0 ± 0.5 SCFH (STANDART CUBIC FEET PER HOUR)

INITIAL POSITION OF PIN GRIPPER

LIFT POSITION OF PIN GRIPPER

DESIRABLE PIN REMOVAL

UNDESIRABLE (FAILURE) PIN REMOVAL

GOOD PIN ATTACH OPERATION

GOOD PIN ATTACH OPERATION INCOMPLETE SOLDER CONTINIUM

PROGRAMMED TIME / TEMP CURVE

PROCESS PARAMETERS

REGION A = 6.0 TO 6.5°/SEC
REGION B = 3.5 TO 4.0°/SEC
REGION C    50°C/SEC FIRST 3 SEC
VOLTAGE : 42.6 ± 0.2 VDC
$N_2$ FLOW: 16.5 ± 0.5 SCFH

PROCESS AND APPARATUS FOR INDIVIDUAL PIN REPAIR IN A DENSE ARRAY OF CONNECTOR PINS OF AN ELECTRONIC PACKAGING STRUCTURE

FIELD OF THE INVENTION

The invention is directed to process and apparatus for the removal, site preparation and replacement of any single connector pin contained, within a sizable array of closely spaced connector pins, on an electronic packaging structure (substrate or module) without causing deleterious metallurgical effects either to the remaining pins or the ceramic substrate.

BACKGROUND OF THE INVENTION AND PRIOR ART

It is common in the industry to fabricate a plurality interconnected integrated circuits on a single semiconductor chip. In many applications, the chip is attached to a packaging substrate by a method and structure known as flip chip bonding where interconnecting circuitry on the face of the chip is reflow soldered directly to the substrate. (For a description of "Flip Chip Bonding", see, for example, U.S. Pat. Nos. 3,429,040 and 3,517,278.) Typically, chip sizes may vary from 0.040 inch square to 0.125 inch square and larger. Increasing sophistication in the semiconductor industry has resulted in the increase in size of individual chips as well as an increase in the number and circuit density of chips mounted on a single substrate or packaging structure. In order to connect circuitry on the chips to external circuits a plurality of contact points on the chip must be accurately aligned to matching contact points on the substrate. The number of contact points, or C4 connections, required depends upon the circuit density and complexity of integrated circuit chips. The number of solder connections between a integrated circuit chip flip chip bonded to the substrate of a packaging structure may be one hundred to two hundred or greater.

A significant problem in the manufacture of integrated circuit modules is the high cost of individual chips and/or modules, where a module may be defined as an integrated circuit packaging structure. It is no longer economically feasibly to disgard modules which contain defective chips, bonds and/or connector pins due to the high dollar value involved. Therefore, it has become very necessary to devise methods of repairing modules by replacing defective chips, bonds and/or connector pins without affecting quality of adjacent chips and/or connector pins. Other problems including misalignment of chips and defective bonding also require the use of repair techniques. While batch furnace methods and techniques are satisfactory to originally bond all chips and connector pins, these methods are not acceptable as repair techniques. Individual chips must be removable without effecting the integrity of adjacent chip bonding or the quality of chip circuitry. An effective repair technique must include a means for applying a concentrated source of heat to an individual chip at such a rate as to not overheat an adjacent chip by conduction through the substrate. Various methods of applying a concentrated source of heat to an individual chip have been previously suggested. Typical heat sources include laser, electron beam, infrared, resistance heating, hot gas and flame. All these sources are capable of supplying a sufficient quantity of heat but in practice it has been found that accurate control of the temperature of the chips is extremely difficult due to the varying nature of the diffusion bond between the chips, solder alloy and substrate. Additionally, many sources, for example hot gas, are difficult to apply to a limited area without adversely affecting adjacent chips. In other methods, the heat applied to defective chips is so intense that removed chips are completely destroyed and therefore unavailable for reuse or quality control evaluation purposes.

Another problem in the repair of modules presented by the nature of diffusion bonding alloys is that only a limited number of solder reflow cycles are permissible without destroying the integrity of the metallurgical bond due to diffusion between the solder alloy and the chip or substrate base metallurgy. In order to achieve the maximum number of repair cycles for a single multichip substrate, heating techniques such as reflowing all the chips on the substrate in a manner similar to that used to originally bond the chips is unsatisfactory due to the limitation on the number of reflow cycles each chip is capable of safely withstanding. U.S. Pat. No. 3,735,911 is directed to an integrated circuit chip repair tool for bonding or removing reflow soldered chips on a multi-chip substrate.

The present trends in microelectronics towards large scale integration require the use of semiconductor packages that interconnect and support a plurality of semiconductor devices. Such a package may include, for example, a multi-layer ceramic substrate with many semiconductor devices solder bonded to interconnection metallurgy in the substrate. Such a package is described and claimed in U.S. Pat. Nos. 4,245,273 and 4,302,625. U.S. Pat. Nos. 3,993,123 and 4,138,692 each disclose integrated circuit packaging structures ("Gas Encapsulated Cooling Modules") employing a multilayer ceramic substrate with many semiconductor devices solder bonded thereto.

When the foregoing type of multiple semiconductor device module is used in mass production, especially for high performance computers, the need for replacing one or more devices may arise if the latter has been found defective. The probability of this need increases as the number of devices contained in the module increases. The need is for a method of removing the defective devices from a given site, preparing the site for a new device and subsequently joining the new device. Examples of the background technique related to the removal of the devices by thermal methods are given in IBM Technical Disclosure Bulletin in the articles "Use of a Heated Jet to Remove a Silicon Chip Soldered to a Substrate", by K. S. Sachar et al, Vol. 20, No. 9 Feb. 1978 P. 3725, and "Inverted Hot Gas Selected Chip Removal" by L. R. Cutting et al, Vol. 21, No. 9, Feb. 1979 P. 3592. However, the most difficult task is to re-condition the solder pads on the substrate after the device has been removed. This normally consists of eliminating the solder partially but not entirely at the pad site. It is desirable that such a method be rapid, simple, and of low cost. It must not affect the adjacent devices or damage the metallurgy network present on the substrate surface, or produce solder runs that might result in undesirable short circuits between the conductor stripes or pads.

The removal of solder bonded devices with known conventional device removal techniques leaves a great deal of solder on the pad of the substrate. The amount varies with the removal technique, but is usually in the range of 30% to 80% of the total amount of solder used in the solder bonds. This amount of solder is excessive and must be removed before a replacement device can be joined. Generally only 10-15% of the total solder should remain on the pads in preparation for a subsequent device joining operation. U.S. Pat. No. 4,444,559 is directed to a rework method for removing a solder bonded integrated circuit chip from a ceramic substrate leaving only a coating of solder on the pad site sufficient to solder bond another integrated circuit chip without the need for additional site preparation.

As briefly stated hereinabove a significant problem in the manufacture of integrated circuit modules is the removal and replacement of a single defective connector pin in an array of small closely spaced connector pins. This solution to the problem is to provide a method and apparatus for efficiently and economically accomplishing this task without adversely effecting the surrounding connector pins and the metal-ceramic interfaces of the surrounding pins and the pin under repair. Applicant's invention, as fully disclosed herein is directed to the solution of the above identified problem of connector pin removal and replacement. Applicants have carefully reviewed and experimented with a number of known prior art techniques of removing and replacing a single pin in a dense array and found them to be grossly unsatisfactory. The prior art techniques in the IBM Technical Disclosure Bulletin publications (fully identified hereinafter) by J. R. Lynch, J. J. Dankelman et al and J. Furrari, each directed to pinning or pin repair, have been reviewed.

As will be fully apparent from the detailed description hereinafter applicants' invention has particular utility and advantage when utilized to remove and replace a single connector pin an integrated circuit packaging structure having a sizeable array of closely spaced, small connector pins, such as employed in the commercial structure termed "Thermal Conduction Module" (TCM).

The high density packaging structure containing a plurality of interconnected semiconductor chips may be generally of the type disclosed in IBM NEWS SPECIAL EDITION November 1980, Copyright 1980 by International Business Machines. The high density packaging structure is termed a "Thermal Conduction Module".

The "Thermal Conduction Module" has a sizeable number of chip sites available, for example, 100 or 118. The chips are placed on—and are interconnected by—a large, multi-layer ceramic substrate whose power and input/output capability is provided through 1800 pins extending from the bottom of the substrate. The chip-populated substrate is placed in a cooling frame where spring loaded pistons that are part of the cooling "hat" subassembly come in contact with each chip. In addition to providing a housing for the pistons, the hat contains helium gas which also helps transmit heat from the chips. Subsequently, the hat is attached to a water (or liquid) cooled assembly.

The "Thermal Conduction Modules" multi-layer ceramic substrate is formed from sheets of unfired (green) ceramic, which are "personalized" according to the function each sheet is to perform. First, thousands of minute holes, or vias, are punched in each sheet. The wiring pattern which conducts the electrical signals, is formed by screening a metallic paste onto the sheet through a metal mask. The via holes are also filled with this paste to provide the electrical connections from one layer or sheet to another. The layers are stacked and laminate together under heat and pressure. The laminate is then sintered in a process which shrinks it. This results in a substrate of tile-like hardness with the desired electrical characteristics. Additional metals are plated on the substrate to provide reliable contact surfaces for subsequent chip placement and pin attachments as well as for adding wiring. A finished substrate may have dimensions in the order of 90 millimeters (3.5 inches) square and 5.5 millimeters (2/10 inch) thick.

In the "Thermal Conduction Module", for example, each pin of the dense array of closely spaced small connector pins is 0.090 inches (2.28 millimeters) in height 0.013 inches (0.33 millimeters) in diameter and uniformly space 0.100 inches (2.52 millimeters) from adjacent pins.

The technique of joining (connecting) the chips to the substrate may be generally in accordance with the method disclosed in U.S. Pat. No. 3,429,040 entitled "Method of Joining A Component To A Substrate" granted Feb. 25, 1969 to L. F. Miller.

BACKGROUND ART

The following patents and publications are directed to soldering techniques for fastening chips and/or pins to substrates of integrated circuit packaging structures. It is to be appreciated, with reference to the subject invention, that the following art is not submitted to be the only prior art, the best prior art, or necessarily the most pertinent prior art.

Patents

U.S. Pat. No. 3,283,124 entitled "Selective Heating Apparatus" by R. J. Kawecki, issued Nov. 1, 1966 and assigned to IBM Corp.

U.S. Pat. No. 3,374,531 entitled "Method of Soldering With Radiant Energy by D. V. Bruce, issued Mar. 26, 1968.

U.S. Pat. No. 3,429,040 entitled "Method of Joining a Component to a Substrate" by L. F. Miller issued Feb. 25, 1969 and assigned to the IBM Corp.

U.S. Pat. No. 3,469,061 entitled "Solder Apparatus" by B. J. Costello, issued Sept. 23, 1969.

U.S. Pat. No. 3,517,278 entitled "Flip Chip Structure" by R. W. Hager issued June 23, 1970.

U.S. Pat. No. 3,586,813 entitled "Simultaneous Multiple Lead Bonding" by D. G. Cruickshank et al, issued June 22, 1971.

U.S. Pat. No. 3,653,572 entitled "Hot Gas Solder Removal" by S. Z. Dushkes et al, issued Apr. 4, 1972 and assigned to IBM Corp.

U.S. Pat. No. 3,710,069 entitled "Method of and Apparatus For Selective Solder Reflow" by J. A. Papadopoulos et al, issued Jan. 9, 1973 and assigned to IBM Corp.

U.S. Pat. No. 3,735,911 entitled "Integrated Circuit Chip Repair Tool" by W. C. Ward, issued May 29, 1973 and assigned to IBM Corp.

U.S. Pat. No. 3,751,799 entitled "Solder Terminal Rework Technique" by J. J. Reynolds, issued Aug. 14, 1973 and assigned to IBM Corp.

U.S. Pat. No. 3,993,123 entitled "Gas Encapsulated Cooling Module" by R. C. Chu et al issued Nov. 23, 1976 and assigned to the IBM Corp.

U.S. Pat. No. 4,066,204 entitled "Process and Device For Unsoldering Semiconductor Modules in the Flip-Chip Technique" by O. Wirbser et al, issued Jan. 3, 1978.

U.S. Pat. No. 4,138,692 entitled "Gas Encapsuled Cooling Module" by R. G. Meeker et al issued Feb. 6, 1979 and assigned to the IBM Corp.

U.S. Pat. No. 4,160,893 entitled "Individual Chip Joining Machine" by R. H. Meyen et al, issued July 10, 1979 and assigned to IBM Corp.

U.S. Pat. No. 4,245,273 entitled "Package For Mounting and Interconnecting A Plurality of Large Scale Integrated Semiconductor devices" by I. Feinberg et al, issued Jan. 13, 1981 and assigned to the IBM Corp.

U.S. Pat. No. 4,270,260 entitled "Method For The Salvage and Restoration of Integrated Circuits From a Substrate" by E. F. Krueger, issued June 2, 1981.

U.S. Pat. No. 4,295,596 entitled "Methods and Apparatus For Bonding an Article to a Metallized Substrate" by B. O. Doten et al, issued Oct. 20, 1981.

U.S. Pat. No. 4,302,625 entitled "Multi-Layer Ceramic Substrate" by R. J. Hetherington, issued Nov. 24, 1981 and assigned to the IBM Corp.

U.S. Pat. No. 4,444,559 entitled "Process and Apparatus For Unsoldering Solder Bonded Semiconductor Devices" by Karl Schink et al, issued Apr. 24, 1984 and assigned to the IBM Corp.

IBM Technical Disclosure Bulletin Publications

"Extraction Tool" by A. W. Northrop et al, Vol. 3, No. 5, Oct. 1960, pg. 8.

"Chip Removal By Hot Gas" by C. R. Tickner, Vol. 11 No. 7, December 1968, pg. 875.

"Infrared Chip Repair Tool" by M. Beliveau et al., Vol. 13 No. 7, December 1970, pg. 1811-12.

"Circuit Board Module Replacement Tool" by A. S. Baweja et al, Vol. 13 No. 7, December 1970, page 2107.

"Pinning Technique For Ceramic Module" by J. R. Lynch, Vol. 14, No. 1, June 1971, pages 174-5.

"Integrated Circuit Device Recovery and Restoration Technique" by P. A. Totta, Vol. 17 No. 1, June 1974, pages 113-14.

"Low-Temperature Soldered Component Removal" by W. C. Ward, Vol. 19 No. 7, December 1976, page 2476.

"Use of a Heated Gas Jet To Removal a Silicon Chip Soldered to a Substrate" by K. S. Sachar et al, Vol. 20 No. 9, February 1978, page 3725-26.

"Inverted Hot Gas Selected Chip Removal" by L. R. Cutting et al, Vol. 21 No. 9, February 1979, page 3592.

"Pin Repair Reflow Capillary" by J. J. Dankelman et al, Vol. 22 No. 2, July 1979, pages 565-66.

"Pseudo-Brewster Angle of Incidence For Joining or Removing a Chip By Laser Beam" by J. C. Chastang et al, Vol. 23 No. 11, April 1981, page 5194-95.

"Module Pin Repair Technique" by J. Funari et al, Vol. 24, No. 2, July 1981, page 1249.

"Laser Individual Chip Rework (Laser ICR) System by W. O. Druschel, et al, Vol. 27 No. 12, May 1985, page 7110.

SUMMARY OF THE INVENTION

During the manufacturing cycle, any multilayer ceramic product that has I/O pins, may require one or more of its pins replaced due to accidental damage or part malfunctioning (pins, braze, etc.). This replacement may be required at any stage of manufacturing, including as a totally populated and operational module, such as a TCM module. Inability to repair a damaged I/O pin requires an extremely lengthy and costly rework cycle or the module is scraped.

The disclosed hot gas process and tooling, in accordance with the invention, successfully addresses and solves the single pin removal and replacement problems for packaging structures such as MLC's and TCM's.

The process and tooling, in accordance with the invention, also provides capability of removing a shankless pin (pin broken off and only the head remaining).

Set forth below is a summarized comparison between the known prior art microflame process and the hot gas process in accordance with the invention.

| Process Required | Known Microflame Process | Applicant's Hot Gas Process |
|---|---|---|
| Remove Pin on Substrate | Can do | Can do |
| Attach Pin on S/S | Can not do | Can do |
| Remove Pin on Module | Can do | Can do |
| Attach Pin on Module | Can not do | Can do |
| Remove Shankless Pin | Can not do | Can do |
| Controlled Heatup Profile | Can not do | Can do |
| Controlled Cooldown Profile | Can not do | Can do |

The problem solved is the removal of an I/O pin, whole or shankless and replacement (pin attach) of a brazed pin on any single or multilayer ceramic substrate or module without causing deleterious metallurgical effects either to the remaining pins, ceramic substrate, devices (chips), seals or any part of an assembled module. The process requires controlled power settings, gas flow/pressure settings and time/temperature profiles to insure no ceramic failure will occur. The process requires novel apparatus including nozzle size and configuration to meet pin fillet size and continium around pin head, with a prescribed solder preform during the pin attach cycle. The cooldown cycle, after pin remove or attach, is also closely controlled.

Process and tooling has capability of multiple repair on the same site. This cannot be achieved by prior art techniques without metallurgical degradation or ceramic tearout.

Pin Hardware

The apparatus for the practice of the invention has the following capabilities:

a. Retaining a substrate or module with pins in the up-right position.

b. Unique universal fixturing for all MLC products with top (pin side) registration to handle various product thickness.

c. Indexing subject substrate or module accurately from pin to pin.

d. Fine adjust stage for product pin location variability.

e. Tooling Head equiped with "tweezer like" device (or pin gripper) for gripping pin or pin head if shankless, and lifting at appropriate time (reflow).

f. Electrical power settings and inert gas flow/power settings that provide a unique window to achieve the required process in a non-oxidizing atmosphere at a specific heatup and cooldown temperature profile.

g. Nozzle of critical dimensions in length, diameter, wall thickness and material.

h. Appropriate timing circuitry to maintain time dependent process parameters.

i. Microscope for operator observation.

Pin Remove Process may be summarized as follows:

a. Substrate or module with bad or damaged pin(s) to be removed is loaded into X-Y movable stage.
b. Operator indexes pin under work station.
c. Operator using fine adjust mechanism, locates pin to gripper, with gripper assembly in down position.
d. Actuates gripper (closes gripper) and exerts a predetermined upward force built into the tooling. Two cases:
  1. Gripper holds pin as normal pin remove.
  2. Gripper digs into braze material and as reflow starts, continues closing until reaching pin head. (Shankless pin remove.)
e. Hot Gas (N$_2$) heats the site and pin to a prescribed thermal profile. At reflow the gripper assembly lifts the pin approximately 60 mils and maintains position over site.
f. Nozzle heater is shut off but flow is maintained, therby stripping residual heat within the system to provide a 60 sec. cooldown ramp.
g. Head is lifted and pin dropped into an indexing container.

Pin Attach Hardware

The apparatus for the practice of the invention has the following capabilities:
a. Retraining a substrate or module with pins in the up-right position.
b. Unique universal fixturing for all MLC products with top (pin side) registration to handle various product thicknesses.
c. Indexing subject substrate or module accurately from pin to pin.
d. Traverse Stage that travels from work station to an optical station (Dynascope) to provide alignment capability, so that the new pin to be attached will be placed exactly in the same relative position as the pin removed, even if original pin had placement error, the error is intentionally duplicated.
e. Fine Adjust Stage to manipulate product under the optical stage (Dynascope).
f. Tooling Head consisting of double heater/nozzles that are goemetrically set to critical dimensions and a tube holder that magnetically holds the pin in proper attitude to the workpiece. Tooling head is preloaded to a specified force to take up braze and preform thicknesses at melt and to provide proper join contact.
g. Electrical power settings and gas flow/pressure control settings, that provide a unique window to achieve the required process in a non-oxidizing atmosphere at a specific heatup and cooldown temperature profile.
h. Nozzles of critical dimensions in length, diameter, wall thickness and material. System is extremely well balanced to provide a braze fillet of required height, quality and 360° continium around pin head.
i. Appropriate timing circuitry to maintain time dependent process parameters.
j. Microscope for operator observation.

The Pin Attach Process may be summarized as follows:
a. Substrate or module requiring pin(s) attachment is loaded into X-Y movable stage.
b. Operator indexes site to work station.
c. Operator moves product through use of Traverse Stage under Optical Station (Dynascope) and fine adjusts site (through use of Dynascope graticle and surrounding pins) to exact location of previously removed pin.
d. Moves Traverse Stage back under workstation (this is an accurate and repeatable step between these two stations built into tool, therefore previous alignment in c is not lost).
e. Operator fluxes site, places solder preform on site, inserts pin into holder tube and brings head assembly down.
f. Starts pin attach cycle:
  Head assembly is clamped down with specified preload.
  Heaters and inert gas (N$_2$) is started, providing required heatup rate based on power, flow/pressure settings.
  Observing through microscope, heat cycle is terminated at appropriate time, i.e. braze and proper fillet achieved. Timer is provided not to exceed 80 seconds join time.
g. Controlled cooldown cycle is maintained for 60 seconds.
h. Head is lifted. Attach cycle is complete.

Functional and Structure Features of the Solution:

The need for controlling the thermal pattern results from the sensitivity of the structure to thermal gradients directly through the pin—pad to ceramic interface.

The limiting thermal gradient at the interface was first determined experimentally and later suported by thermal analysis.

To attain the proper thermal distribution through out the structure a proper combination of the following are made:
  Gas type.
  Nozzle(s) configuration size and material.
  Gripper jaws size, configuration and materials.
  Gas flow, pressure and flow distribution.
  Time/temperature heat up profile.
  Time/temperature cool down profile.

The primary object of the invention is to provide a method of removing and replacing a single connector pin in a dense array of closely spaced small connector pins of a micro-electronic packaging structure or module.

A further primary object of the invention is to provide apparatus for removing and replacing a single connector pin in a dense array of closely spaced small connector pins of a micro-electronic packaging structure or module.

The foregoing and other objects, features and advantages of the invention will be apparent from the following more particular description of the preferred embodiments of the invention as illustrated in the accompanying drawings.

BRIEF DESCRIPTION OF THE DRAWING

FIG. 5 depicts an alternate jaw, or "pin gripper" design for removing shankless pins, or the like. In FIG. 5 the jaws of the pin gripper are shown in an initial position preparatory to engaging the head of the shankless pin 1h.

FIG. 11 discloses a side view and a top view.

FIG. 12 discloses a side view and a top view.

FIG. 14 also depicts the sensitive metal/ceramic interface.

FIG. 15 generally depicts an exploded view of a packaging structure generally of the type briefly disclosed hereinabove and referred to as a Thermal Cooling Module (TCM).

FIG. 16 depicts a substrate (or Multilayer Ceramic MLC) having one hundred chips connected to contacts on one surface thereof and a sizeable number of package pins (for example 1800) on the opposite surface thereof. The substrate or MLC contains internal wiring (not shown) for interconnecting the chips and package pins.

PREFERRED EMBODIMENT OF THE INVENTION

Figure 1:
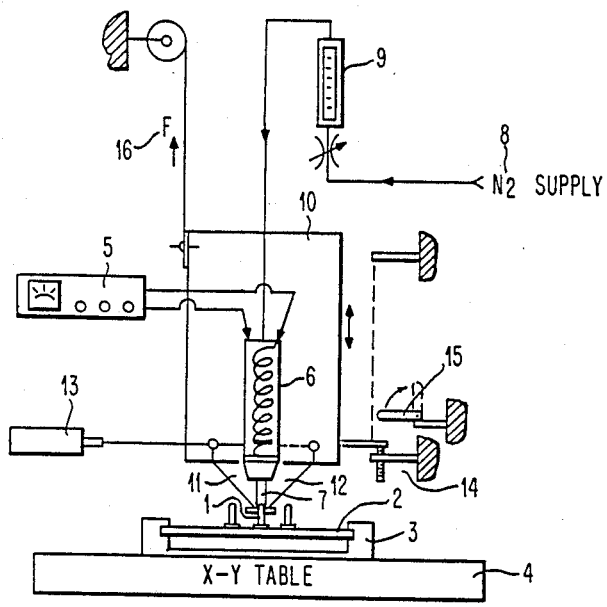
FIG. 1 schematically illustrates the apparatus, or tool, in accordance with the invention, for hot gas pin removal.

FIG. 1 discloses a schematic diagram of the hot gas pin remove tool in accordance with the invention. X-Y table 4 is equipped with fixture 3 to retain multilayer ceramic substrates or modules 2 with pins up. A DC power supply 5 provides energy to the resistor of heater 6 equipped with a specially configured nozzle 7 of selected material and through which pure nitrogen 8 is dispensed. Nitrogen flow is carefully controlled by a precision regulator and flow control valve 9. During the remove cycle the desired pin 1 is brought under the tooling head 10, aligned and grabbed through actuation of air cylinder 13 by specially configured jaws 11 and 12.

Figure 4:
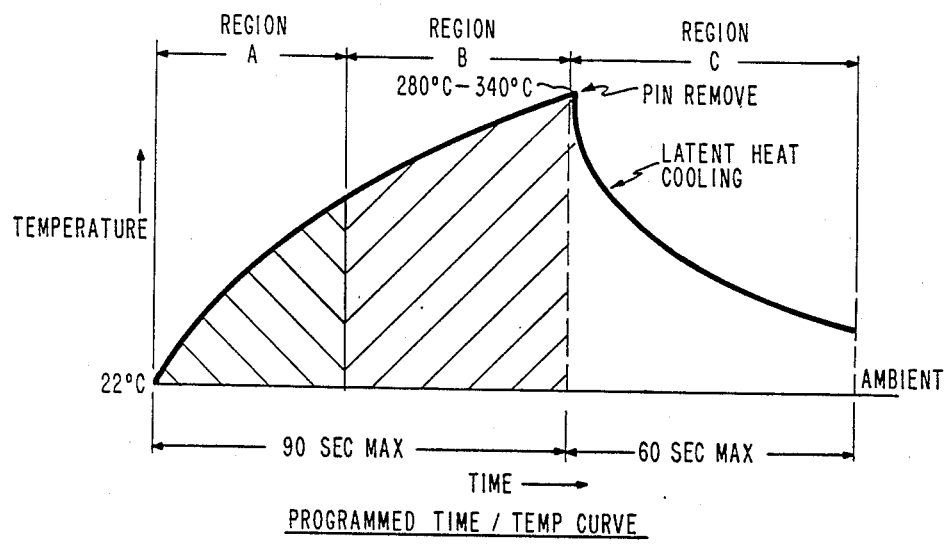
FIG. 4 is a graphical representation of temperature vs. time of a pin remove process cycle. [Initially the voltage and N$_2$ flow were varied to derive the thermal profile and later the specified voltage (measure of power) and N$_2$ flow were held constant after all mechanical parameters were established to obtain required profile.]
Figure 2:
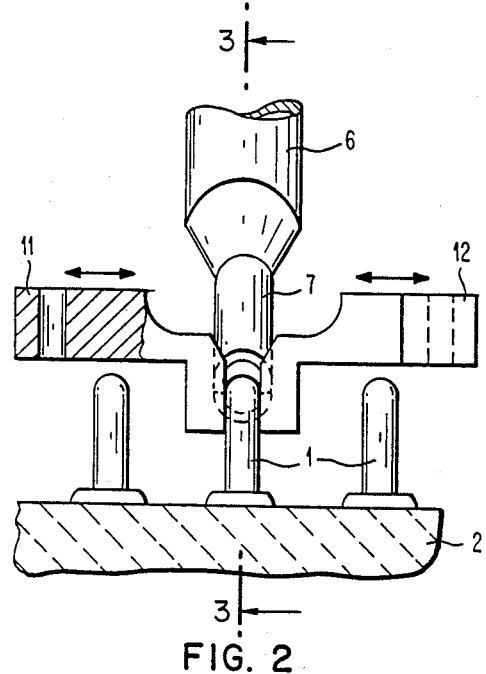
FIG. 2 is an enlarged view of a portion of FIG. 1.
Figure 3:
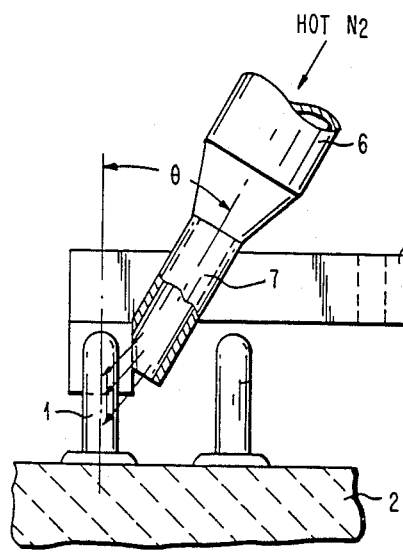
FIG. 3 is a side view of the structure shown in FIG. 2.
Figure 5:
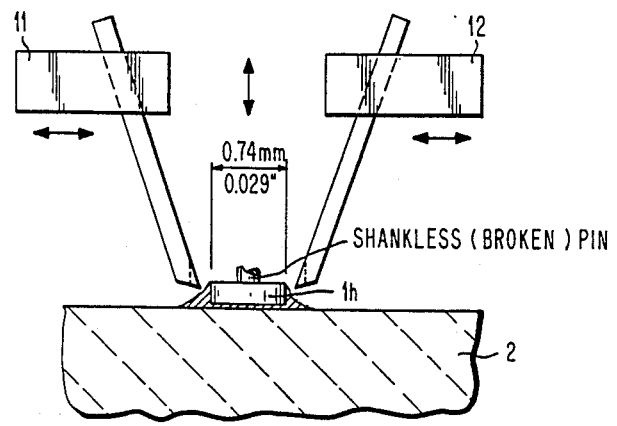
Figure 6:
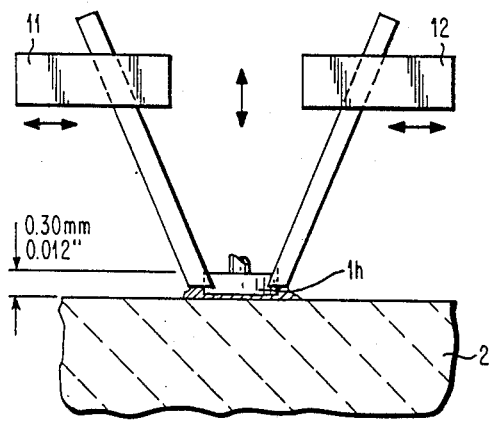
FIG. 6 depicts the alternate jaw, or pin gripper, design in "lift position" prior to lifting the shankless pin from the substrate 2. It is to be noted that in FIG. 6 the jaws 11 and 12 of the pin gripper have mechanically engaged and gripped the head of shankless pin 1h.
Figure 7:
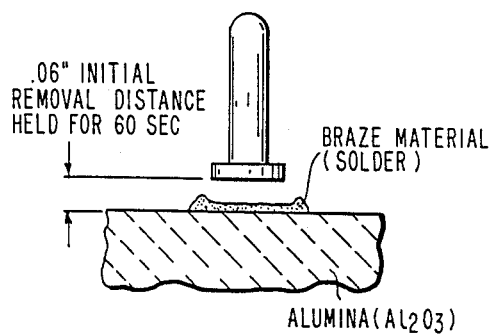
FIG. 7 schematically depicts a cross-sectional portion of the substrate structure and the position of the removed pin subsequent to a successful and proper pin removal operation.

The jaws 11 and 12 are of a preselected material (preferably INCONEL 600) and of extremely sensitive configuration for proper thermal conduction and heat sink characteristics when in contact with pin 1. Nozzle 7's angular displacement from jaws 11 and 12, its having a section removed at the nozzle end adjacent to the gripper and connection pin to be removed and the position of the jaws and nozzle in relationship to the pin is critical for proper pin removal. An adjustable stop 14 provides proper jaw to pin relationship during solder reflow operation. A constant force 16 (75-150 gm) is exerted upwards on the pin during the heat cycle, thereby removing the pin at the earliest possible moment of reflow without unnecessarily overheating the ceramic material. Initial lift distance is held to 0.060" (see FIG. 7) by interposer stop 15 for a duration in the order of 60 seconds to provide controlled rate cooling to substrate 2. This removes residual heat within the mechanical parts of the system. Schematic representation of the pin remove cycle is shown in FIG. 4. An alternate gripper jaw design for removal of shankless pins is shown in FIGS. 5 and 6.

Substrate or modules 2 of the type shown in Firure 15 and 16 are composed of a ceramic material (Alumina $Al_2O_3$) of many layers with internal metalic vias and distribution planes. Substrates or modules are populated with a multiplicity of I/O pins (material: KOVAR) from a few hundred to several thousand. Pins are extremely closely spaced thereby making it very difficult to perform any repair operation on a particular pin without affecting its neighbors. Due to this close pin spacing, repair tooling also has to be of a "watch part" nature with tight tolerances and special materials.

Figure 9:
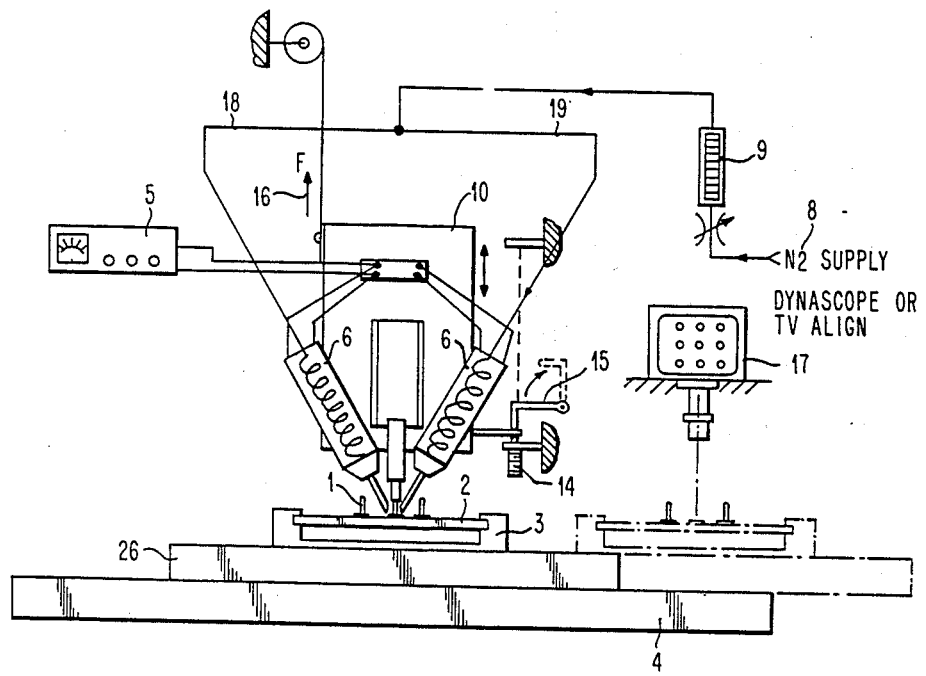
FIG. 9 schematically illustrates the apparatus, or tool, in accordance with the invention for hot gas pin attach.
Figure 10:
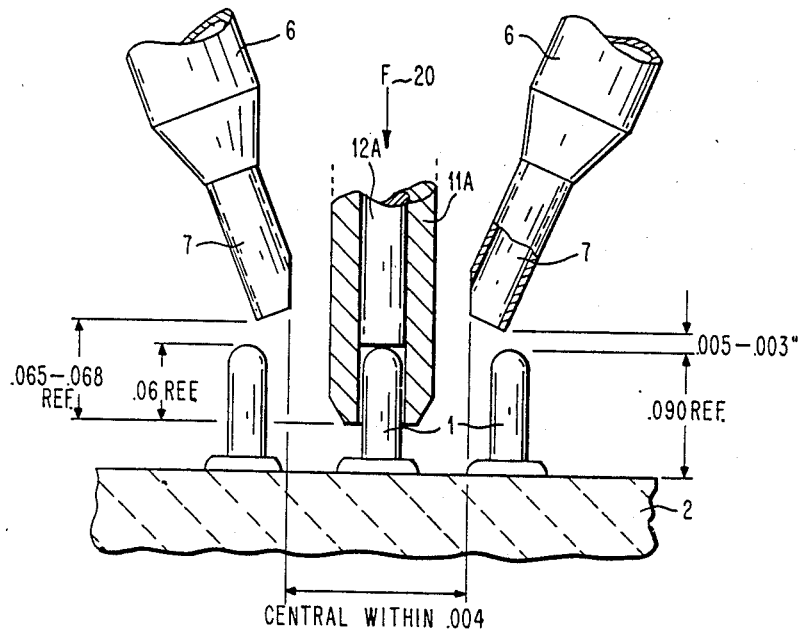
FIG. 10 is an enlarged view of a portion of FIG. 9.

FIG. 9 discloses a schematic diagram of the hot gas attach tool in accordance with the invention. X-Y table 4 is equipped with fixture 3 to retain multilayer ceramic substrates or modules 2 with pins up. A transfer stage 26 is provided to bring product under a special microscope 17 (Dynascope) or TV screen equipped with a special reticle or screen overlay for critical site alignment prior to a pin attach operation. (Pin replacement has to be identical in position, or within 0.0015 inches, to the pin remove operation.) After site alignment, transfer stage 26 is brought back under the tooling head 10, pin 1 is inserted into pin tube 11A, FIG. 10, and magnetically retained in position through pin stop 12A.

DC power supply 5 provides energy to the two serpentine resistance heaters 6 equipped with specially configured nozzle 7 of selected material and through which pure nitrogen 8 is dispensed. Nitrogen is carefully controlled by a precision regulator and flow control valve 9. Equal amounts of nitrogen are supplied by insuring that TYGON tubing lengths 18 and 19 are exactly the same. The pin site is fluxed by the operator and a solder preform of proper volume is placed on the site.

Figure 11:
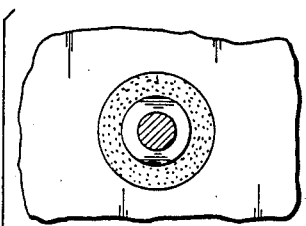
FIG. 11 schematically depicts the resulting desirable (mechanically and electrically sound) "pin attach" structure of a pin attach operation in accordance with the invention.
Figure 11:
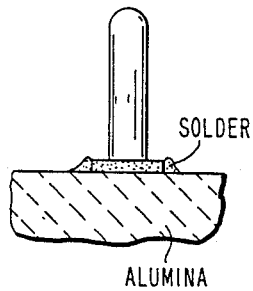
Figure 12:
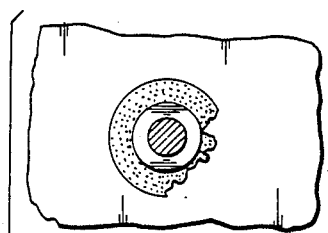
FIG. 12 schematically depicts the resulting undesirable (mechanically and electrically unsound) "pin attach" structure of a pin attach operation in accordance with the prior art.
Figure 12:
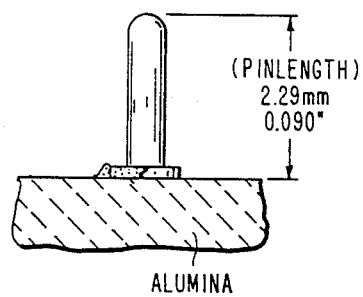
Figure 17:
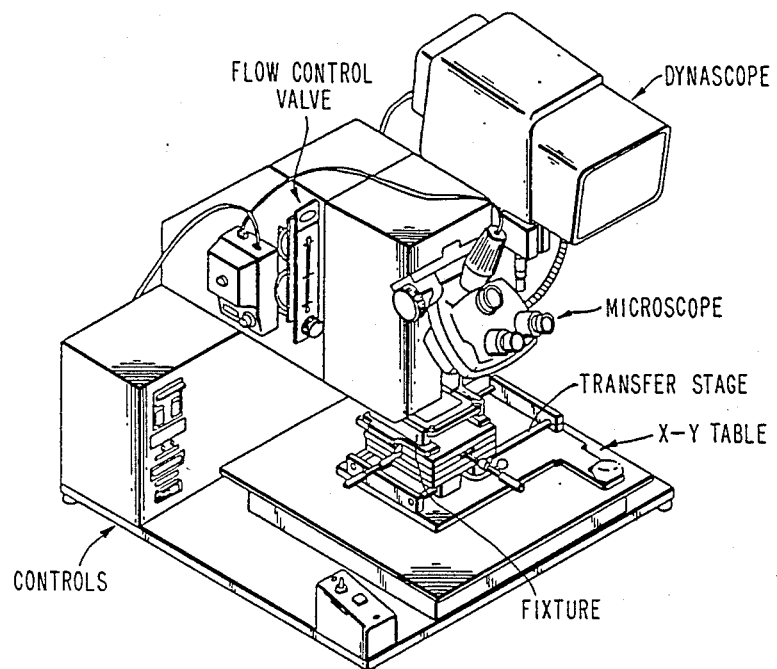
FIG. 17 is an isometric drawing depicting apparatus in accordance with the invention which has been reduced to practice.
Figure 17A:
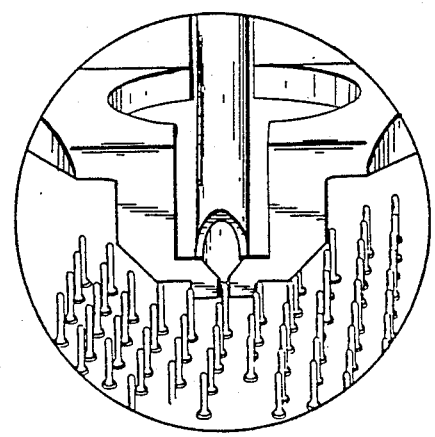
FIG. 17A is an enlargement of the "pin removal" portion of the apparatus depicted in FIG. 17.
Figure 17B:
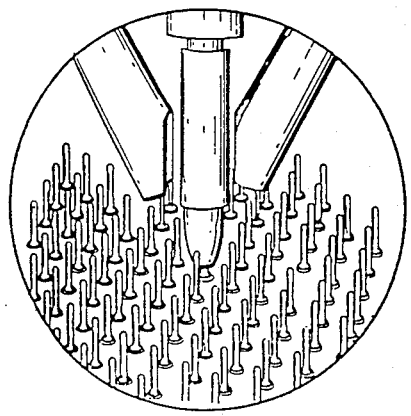
FIG. 17B is an enlargement of the "pin attach" portion of the apparatus depicted in FIG. 17.

At the start of the pin attach cycle, or operation, FIG. 9, the tooling head 10 is brought down to the site with height location thereof being controlled by adjustable stop 14. Simultaniously interposer clamp 15 locks the head 10 in place and exerts a downward force 20 of 100 to 150 grams. During the heat cycle the operator observes the site/pin area through a microscope (FIG. 17) for desired braze criteria as shown in FIG. 11. When the operator aborts the heat cycle and a 60 second cooling cycle is automatically introduced, with all mechanical parts still in the pin-hold position, when the operator observes a proper braze condition. This controlled cooling of the pin/substrate site is provided to strip residual heat from the mechanical parts of the system. At the completion of this cooling cycle, interposer clamp 15 is released and tooling head 10 is retracted back to "home" position by constant spring force 16. Again, as in the pin remove tooling, specially selected materials (preferably INCONEL 600) are used for nozzles 7, pin tube 11 and pin stop 12.

Figure 13:
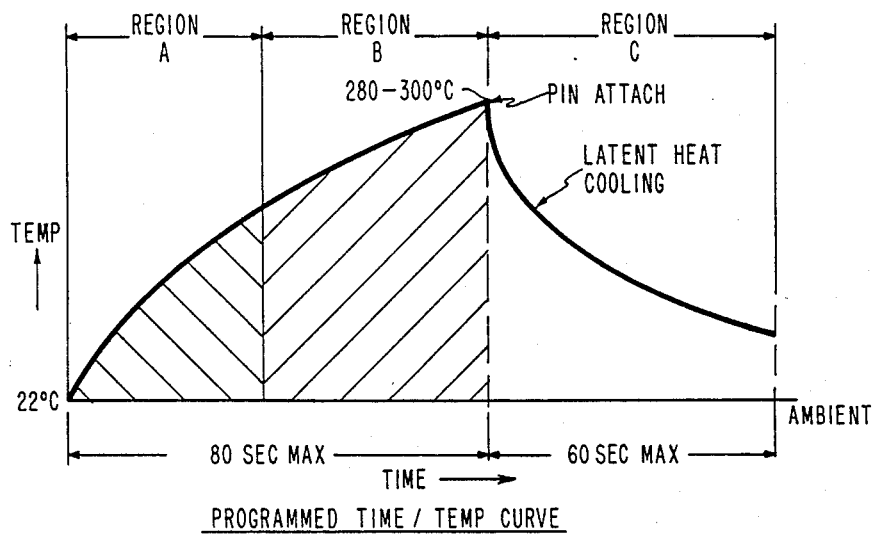
FIG. 13 is a graphical representation of temperature vs. time of a pin attach process cycle. [Initially the voltage and $N_2$ flow were varied to derive the thermal profile and later the specified voltage (measure of power) and $N_2$ flow were held constant after all mechanical parameters were established to obtain required profile].

Schematic representation of pin attach cycle is shown in FIG. 13.

Figure 14:
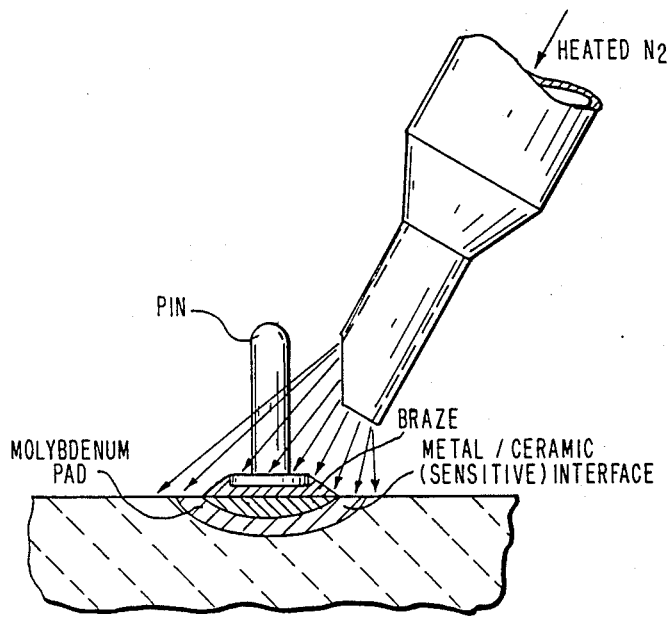
FIG. 14 is a cross-sectional stuctural view of a pin brazed to a ceramic substrate.
Figure 15:
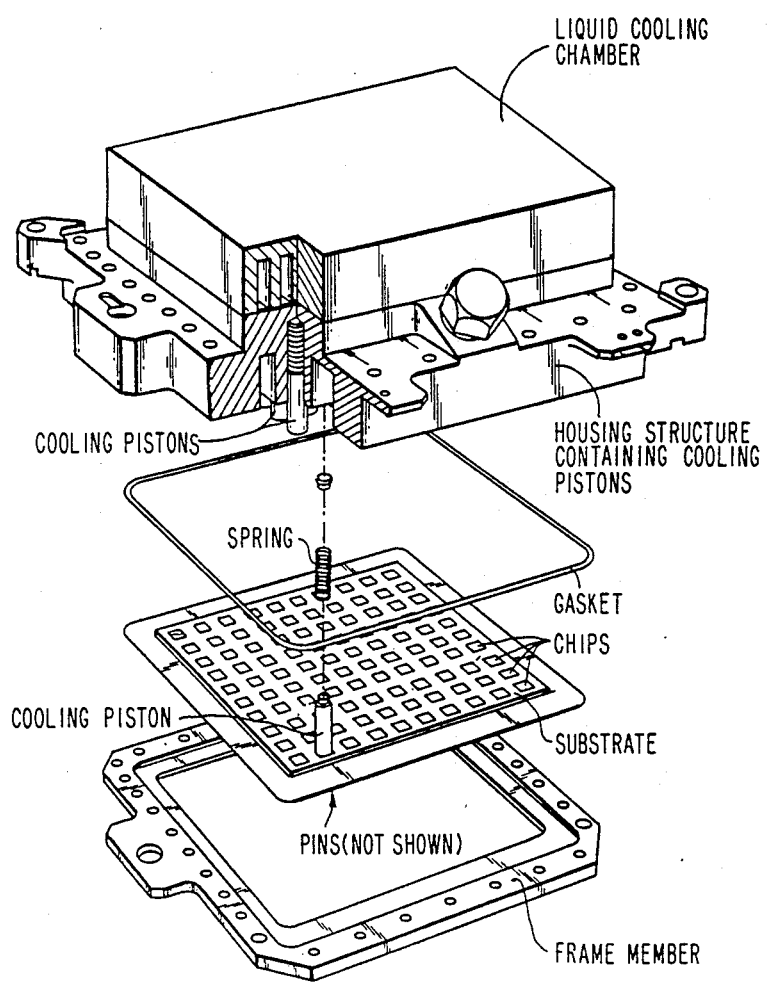
FIGS. 15 and 16 are to be viewed together.
Figure 16:
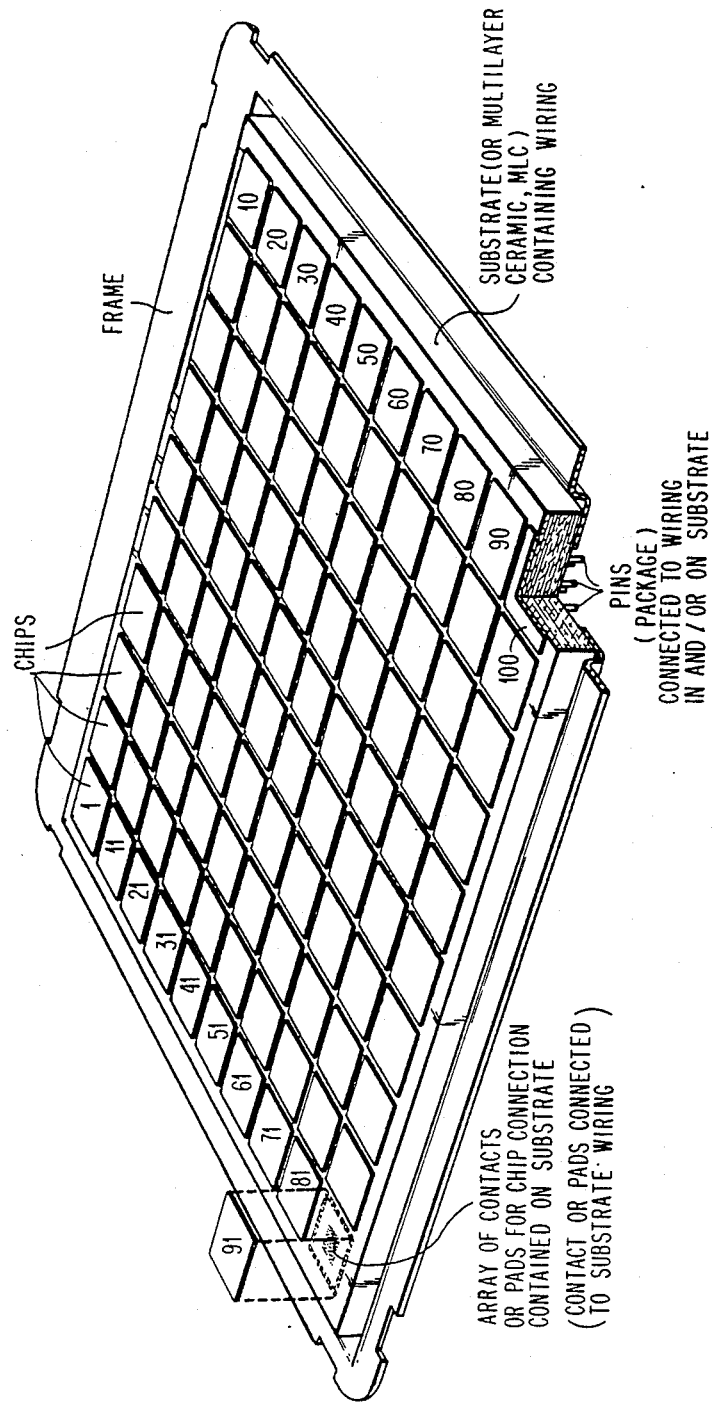

In an MLC structure the pin is attached to the substrate by a furnace reflowed brazing process: the gold-plated KOVAR pin is placed over a volume of gold-tin braze flux material previously screened on to the pin land pad (attach site). The pin land pad is composed of fired molybdenum metal having a surface of electroless nickel and gold plating. In the ceramic-moly firing cycle (approx. 37 hrs at 1500° to 1600° C.) glass presipitates out of the ceramic and builds up along the interface between the moly pad and the ceramic base material. This creates an interface as shown in FIG. 14, which is sensitive to thermal shock (thermal gradient greater than certain critical values, which values vary greatly from part to part and from one lot to another).

Figure 8:
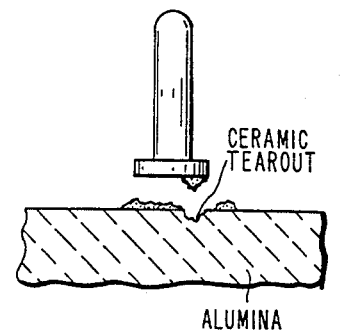
FIG. 8 schematically depicts a cross-sectional view of a portion of the structure and the position of the removed pin subsequent to an unsuccessful (undesirable) pin removal operation.

When individual pins must be replaced in order to salvage a substrate or module, localized heating is applied at a single pin site without disturbing the braze joint of the neighboring pins. It was discovered that the input of thermal energy was extremely critical to insure the integrity of the pin attach structure. Excessive thermal gradients across the sensitive interface would fracture as shown in FIG. 8 or crack the high glass content ceramic and this would weaken the mechanical pin attachment creating a field reliability exposure.

It was determined by extensive experimentation that there are certain critical limits of temperature, time and area which must be maintained to insure against fracture along the sensitive interface. All means of thermal energy input thru the pin, including electrical, resistance heating, direct conduction, gaseous flame, laser, induction, etc. would exceed the thermal gradient limits and cause intermittent fracture.

The heated nitrogen gas jet approach to providing the localized thermal energy needed to repair a single pin was found to be the only practical method which produced consistently good results. This method owes its success to the fact that the physical design of the heating apparatus (nozzle size, shape, angle, spacing, material, etc.) along with the thermal control (gas temperature, time and rate of change—in essence the thermal profile) can be tailored to provide the required thermal envelope. This thermal envelope is specifically tailored for each repair cycle (pin remove and pin attach) and furthermore it proportions the amount of energy entering the structure from the pin inwardly versus that which heats the area around the pin directly.

The critical physical design and thermal profiles specified in herein were derived after much analysis and experimentation and represent a rather narrow process window. This was not intuitively obvious at the onset of the project and was developed thru years of "heat and measure" effort, in which each run was distructively analyzed for the critical fracture effect.

While this invention has been particularly described with reference to the preferred embodiments thereof, it will be understood by those skilled in the art that the foregoing and other changes in form and details may be made therein without departing from the spirit and scope of the invention.

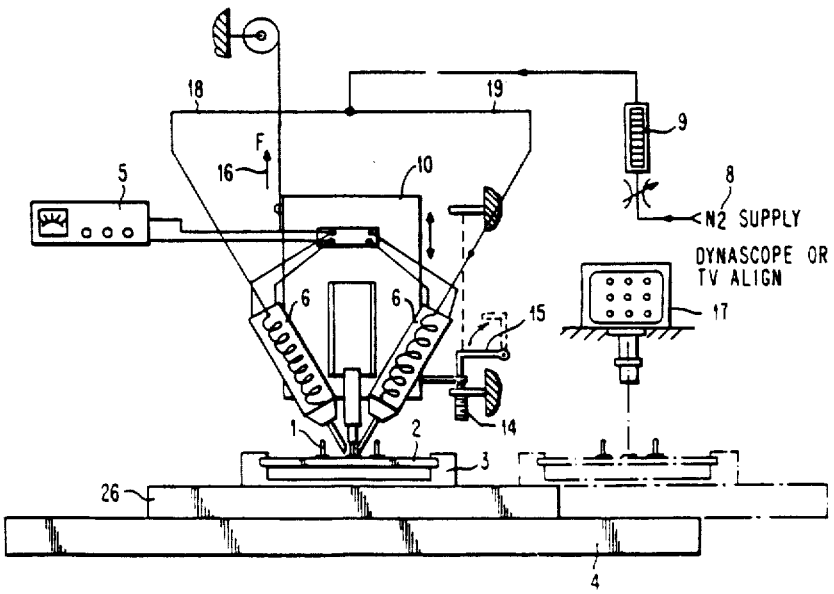

What is claimed is:

1. A method for removing a defective connector pin having a brazed joint, where a brazed joint is defined as the mechanical and electrical joining of a connector pin and a package contact pad by a solder that melts at a lower temperature than that of the joined metals, where said defective connector pin having a brazed joint may be any one of a plurality of connector pins arranged in an array of closely spaced connector pins contained in an integrated circuit package structure, said packaging structure comprising, a substrate having a first planar surface and a second planar surface oppositely disposed from said first planar surface, said first planar surface containing n arrays of closely spaced contact pads, where n is a positive integer greater than one, said second planar surface of said substrate containing an array of closely spaced package contact pads, passive wiring circuit means contained at least in part in said substrate for interconnecting said contact pads of said n arrays of contact pads contained on said first planar surface of said substrate and said package contact pads of said array of package contact pads contained on said second planar surface of said substrate, n interconnected integrated circuit chips, each of said n interconnected integrated circuit chips having a first planar surface and a second planar surface oppositely disposed from said first planar surface, each of said n interconnected integrated circuit chips having an array of chip contact pads on said first planar surface thereof, said array of chip contact pads of each of said n interconnected integrated circuit chips respectively corresponding to and electrically connected to one of said n arrays of contact pads contained on said first planar surface of said substrate, each of said n arrays of chip contact pads providing electrical contact to the integrated circuits contained on the chip corresponding thereto, and each of said package contact pads of said array of closely spaced package contact pads having a connector pin brazed thereto by a brazed joint, said method comprising the following steps:

(a) placing said packaging structure with said array of closely spaced connector pins extending in an upward direction in a fixture movable in first and second orthogonal directions within a plane;

(b) moving said fixture containing said packaging structure to accurately position a connector pin to be removed under a controllable connector pin gripper mechanism, said controllable connector pin gripper mechanism being moveable up and down in a direction perpendicular to the second planar surface of said substrate containing said array of closely spaced connector pins brazed thereto, said gripper mechanism having pin gripper means for gripping said connector pin to be removed;

(c) lowering the controllable pin gripper mechanism to a position where the upper portion of said connector pin to be removed is encompassed by the pin gripper means of the controllable connector pin gripper mechanism;

(d) gripping the connector pin to be removed with the pin gripper means of the controllable connector pin gripper mechanism;

(e) subjecting said controllable connector pin gripper mechanism including said pin gripper means to a relatively constant fixed upper force of predetermined magnitude; and (f) utilizing a hot gas nozzle having a section removed at the end next to said pin gripper means, placing the nozzle close to the connector pin to be removed and inbetween adjacent connector pins subjecting the brazed joint of said connector pin to a controlled stream of heated gas, whereby when the solder of the brazed joint of the connector pin reaches, or closely approaches the reflow temperature of the braze material the connector pin to be removed will be separated from the associated package contact pad.

2. A method for removing a defective connector pin having a brazed joint, where a brazed joint is defined as the mechanical and electrical joining of a connector pin and a package contact pad by a solder that melts at a lower temperature than that of the joined metals, where said defective connector pin having a brazed joint may be any one of a plurality of connector pins arranged in an array of closely spaced connector pins contained in an integrated circuit package structure, said packaging structure comprising, a substrate having a first planar surface and a second planar surface oppositely disposed from said first planar surface, said first planar surface containing n arrays of closely spaced contact pads, where n is a positive integer greater than one, said second planar surface of said substrate containing an array of closely spaced package contact pads, passive wiring circuit means contained at least in part in said substrate for interconnecting said contact pads of said n arrays of contact pads contained on said first planar surface of said substrate and said package contact pads of said array of package contact pads contained on said second planar surface of said substrate, n interconnected integrated circuit chips, each of said n interconnected integrated circuit chips having a first planar surface and a second planar surface oppositely disposed from said first planar surface, each of said n interconnected integrated circuit chips having an array of chip contact pads on said first planar surface thereof, said array of chip contact pads of each of said n interconnected integrated circuit chips respectively corresponding to and electrically connected to one of said n arrays of contact pads contained on said first planar surface of said substrate, each of said n arrays of chip contact pads providing electrical contact to the integrated circuits contained on the chip corresponding thereto, and each of said package contact pads of said array of closely spaced package contact pads having a connector pin brazed thereto by a brazed joint, said method comprising the following steps:

(a) placing said packaging structure with said array of closely spaced connector pins extending in an upward direction in a fixture movable in first and second orthogonal directions within a plane;

(b) moving said fixture containing said packaging structure to accurately position a connector pin to be removed under a controllable connector pin gripper mechanism, said controllable connector pin gripper mechanism being moveable up and down in a direction perpendicular to the second planar surface of said substrate containing said array of closely spaced connector pins brazed thereto, said gripper mechanism having pin gripper means for gripping said connector pin to be removed;

(c) lowering the controllable pin gripper mechanism to a position where the upper portion of said connector pin to be removed is encompassed by the pin gripper means of the controllable connector pin gripper mechanism;

(d) gripping the connector pin to be removed with the pin gripper means of the controllable connector pin gripper mechanism;

(e) subjecting said controllable connector pin gripper mechanism including said pin gripper means to a relatively constant fixed upper force of predetermined magnitude; and (f) utilizing an elongated hot gas nozzle having a section removed at the end next to said pin gripper means, placing the nozzle close to the brazed joint of the connector pin and in between adjacent connector pins, said nozzle having an axis making an acute angle with the axis of the connector pin to be removed, subjecting said brazed joint to a beam-like stream of Nitrogen gas at a temperature of approximately 550° C. and flow rate of 16 SCFH, whereby when the solder of the brazed joint of the connector pin reaches, or closely approaches, the reflow temperature of the braze material the connector pin to be removed will be separated from the associated package contact pad.

3. A method for removing a defective connector pin having a brazed joint, where a brazed joint is defined as the mechanical and electrical joining of a connector pin and a package contact pad by a solder that melts at a lower temperature than that of the joined metals, where said defective connector pin having a brazed joint may be any one of a plurality of connector pins arranged in an array of closely spaced connector pins contained in an integrated circuit package structure, said packaging structure comprising, a substrate having a first planar surface and a second planar surface oppositely disposed from said first planar surface, said first planar surface containing n arrays of closely spaced contact pads, where n is a positive integer greater than one, said second planar surface of said substrate containing an array of closely spaced package contact pads, passive wiring circuit means contained at least in part in said substrate for interconnecting said contact pads of said n arrays of contact pads contained on said first planar surface of said substrate and said package contact pads of said array of package contact pads contained on said second planar surface of said substrate, n interconnected integrated circuit chips, each of said n interconnected integrated circuit chips having a first planar surface and a second planar surface oppositely disposed from said first planar surface, each of said n interconnected integrated circuit chips having an array of chip contact pads on said first planar surface thereof, said array of chip contact pads of each of said n interconnected integrated circuit chips respectively corresponding to and electrically connected to one of said n arrays of contact pads contained on said first planar surface of said substrate, each of said n arrays of chip contact pads providing electrical contact to the integrated circuits contained on the chip corresponding thereto, and each of said package contact pads of said array of closely spaced package contact pads having a connector pin brazed thereto by a brazed joint, said method comprising the following steps:

(a) placing said packaging structure with said array of closely spaced connector pins extending in an upward direction in a fixture movable in first and second orthogonal directions within a plane;

(b) moving said fixture containing said packaging structure to accurately position a connector pin to be removed under a controllable connector pin gripper mechanism, said connector pin to be removed having a length of approximately 0.090 inches (2.28 mm.) and a diameter of approximately 0.013 inches (0.33 mm.), said connector pin to be removed being equally spaced from adjacent connector pins contained in said array by approximately 0.100 inches (2.52 mm.), said controllable connection pin gripper mechanism being moveable up and down in a direction perpendicular to the second planar surface of said substrate containing said array of closely spaced connector pins brazed thereto, said gripper mechanism having a pair of pin gripper jaws, said pair of pin gripper jaws having an "open state" where the spacing between the jaws of the pair of pin gripper jaws is greater than the diameter of the pin to be removed, said pair of pin gripper jaws also having a "closed state" for firmly gripping the connector pin to be removed;

(c) lowering the controllable connector pin gripper mechanism, with the pin gripper jaws in the "open state", to a position where at least the upper portion of the connector pin to be removed is encompassed by the pin gripper jaws of the controllable pin gripper mechanism;

(d) placing the pin gripper jaws of the controllable connector pin gripper mechanism in their "closed state" to thereby firmly grip the connector pin to be removed;

(e) subjecting said controllable connector pin gripper mechanism including said pin gripper means to a relatively constant fixed upper force of predetermined magnitude; and (f) utilizing an elongated hot gas nozzle having a section removed at the end next to said pin gripper means, placing the nozzle close to the brazed joint of the connector pin and in between adjacent connector pins, said nozzle having an axis making an acute angle with the axis of the connector pin to be removed, subjecting said brazed joint to a beam-like stream of Nitrogen gas at a temperature of approximately 550° C. and flow rate of 16 SCFH, whereby when the solder of the brazed joint of the connector pin reaches, or closely approaches, the reflow temperature of the braze material the connector pin to be removed will be separated from the associated package contact pad.

4. A method for for inserting and brazing a connector pin in an array of closely spaced connector pins contained in an integrated circuit package structure, where each of said connector pins in said array is brazed to a package contact pad by a brazed joint, and said connector pin to be inserted in said array is to be brazed to a package contact pad in said array by a brazed joint, where a brazed joint is defined as the mechanical and electrical joining of a connector pin and a package contact pad by a solder that melts at a lower temperature than that of the joined metals, said packaging structure comprising, a substrate having a first planar surface and a second planar surface oppositely disposed from said first planar surface, said first planar surface of said substrate containing n arrays of closely spaced contact pads, where n is a positive integer greater than one, said second planar surface of said substrate containing an array of closely spaced package contact pads, passive wiring circuit means contained at least in part in said substrate for interconnecting said contact pads of said n arrays of closely spaced contact pads contained on said first planar surface of said substrate and said closely spaced package contact pads of said array of package contact pads contained on said second planar surface of said substrate, n interconnected integrated circuit chips, each of said n interconnected integrated circuit chips having a first planar surface and a second planar surface oppositely disposed from said first planar surface, each of said n interconnected integrated circuit chips having an array of chip contact pads on said first planar surface thereof, said array of chip contact pads of each of said n interconnected integrated circuit chips respectively corresponding to and electrically connected to one of said n arrays of contact pads contained on said first planar surface of said substrate, each of said n arrays of chip contact pads providing electrical contact to the integrated circuits contained on the chip corresponding thereto, and each of said package contact pads, except at least one, of said array of closely spaced package contact pads having a connector pin brazed thereto by a brazed joint, said method comprising the following steps:

(a) placing said packaging structure with said array of closely spaced connector pins extending in an upward direction in a fixture movable in first and second orthogonal directions within a plane;

(b) moving said fixture containing said packaging structure to accurately position a package contact pad requiring a brazed connector pin, under a controllable connector pin insertion mechanism, said controllable connector pin insertion mechanism being moveable up and down in a direction perpendicular to the second planar surface of said substrate containing said array of closely spaced connector pins brazed thereto, said controllable connector pin insertion mechanism having a pin holding means holding a upper portion of the pin to be inserted in said array, said pin holding means holding said pin above the package contact pad to which said pin is to be brazed;

(c) lowering the controllable connector pin insertion mechanism and the pin holding means to a position where the exposed lower end of the connector pin to be inserted in the array, and brazed to the package contact pad, is in physical contact with the package contact pad;

(d) subjecting said controllable connector pin insertion mechanism including said pin holding means containing said pin to be inserted to a relatively constant fixed downward force of predetermined magnitude, said force being in the direction of said package contact pad;

(e) utilizing a hot gas nozzle having a section removed at the end next to said pin holding means, and placing the nozzle close to the connector pin to be inserted and in between adjacent connection pins, subjecting the lower portion of said connector pin to be brazed to said package contact pad to a controlled stream of heated gas, whereby when the solder of the braze material reaches the reflow temperature of the braze material the lower end of the connector pin to be inserted and the package contact pad to which it is to be brazed will be encompassed by the braze material;

(f) after the brazed material has reached the reflow temperature thereof, terminating the stream of heated gas; and (g) a predetermined time after the stream of heated gas has been terminated, removing the downward force on the pin insertion mechanism, and raising the controllable pin insertion mechanism whereby a connector pin has been inserted in the array of connector pins and the inserted connector pin has been brazed to a package contact pad.

5. A method for for inserting and brazing a connector pin in an array of closely spaced connector pins contained in an integrated circuit package structure, where each of said connector pins in said array is brazed to a package contact pad by a brazed joint, and said connector pin to be inserted in said array is to be brazed to a package contact pad in said array by a brazed joint, where a brazed joint is defined as the mechanical and electrical joining of a connector pin and a package contact pad by a solder that melts at a lower temperature than that of the joined metals, said packaging structure comprising, a substrate having a first planar surface and a second planar surface oppositely disposed from said first planar surface, said first planar surface of said substrate containing n arrays of closely spaced contact pads, where n is a positive integer greater than one, said second planar surface of said substrate containing an array of closely spaced package contact pads, passive wiring circuit means contained at least in part in said substrate for interconnecting said contact pads of said n arrays of closely spaced contact pads contained on said first planar surface of said substrate and said closely spaced package contact pads of said array of package contact pads contained on said second planar surface of said substrate, n interconnected integrated circuit chips, each of said n interconnected integrated circuit chips having a first planar surface and a second planar surface oppositely disposed from said first planar surface, each of said n interconnected integrated circuit chips having an array of chip contact pads on said first planar surface thereof, said array of chip contact pads of each of said n interconnected integrated circuit chips respectively corresponding to and electrically connected to one of said n arrays of contact pads contained on said first planar surface of said substrate, each of said n arrays of chip contact pads providing electrical contact to the integrated circuits contained on the chip corresponding thereto, and each of said package contact pads, except at least one, of said array of closely spaced package contact pads having a connector pin brazed thereto by a brazed joint, said method comprising the following steps:

(a) placing said packaging structure with said array of closely spaced connector pins extending in an upward direction in a fixture movable in first and second orthogonal directions within a plane;

(b) moving said fixture containing said packaging structure to accurately position a package contact pad requiring a brazed connector pin, under a controllable connector pin insertion mechanism, said controllable connector pin insertion mechanism being moveable up and down in a direction perpendicular to the second planar surface of said substrate containing said array of closely spaced connector pins brazed thereto, said controllable connector pin insertion mechanism having a pin holding means holding a upper portion of the pin to be inserted in said array, said pin holding means holding said pin above the package contact pad to which said pin is to be brazed;

(c) lowering the controllable connector pin insertion mechanism and the pin holding means to a position where the exposed lower end of the connector pin to be inserted in the array, and brazed to the package contact pad, is in physical contact with the package contact pad;

(d) subjecting said controllable connector pin insertion mechanism including said pin holding means containing said pin to be inserted to a relatively constant fixed downward force of predetermined magnitude, said force being in the direction of said package contact pad;

(e) utilizing first and second elongated oppositely disposed hot gas nozzles each having a section removed at the next to said pin holding means, placing the nozzles close to the brazed joint of the connector pin and brazing material to be inserted, and the nozzles being in between adjacent connection pins, each of said nozzles having an axis making an acute angle with the axis of the connector pin to be inserted, inserted, subjecting said brazed joint to first and second beam-like streams of Nitrogen gas at a temperature of approximately 550° C. and each stream having a flow rate of approximately 16.5 SCFH;

(f) after the brazed material has reached the reflow temperature thereof, terminating the stream of heated gas; and (g) a predetermined time after the stream of heated gas has been terminated, removing the downward force on the pin insertion mechanism, and raising the controllable pin insertion mechanism whereby a connector pin has been inserted in the array of connector pins and the inserted connector pin has been brazed to a package contact pad.

6. A method for inserting and brazing a connector pin in an array of closely spaced connector pins contained in an integrated circuit package structure, where each of said connector pins in said array is brazed to a package contact pad by a brazed joint, and said connector pin to be inserted in said array is to be brazed to a package contact pad in said array by a brazed joint, where a brazed joint is defined as the mechanical and electrical joining of a connector pin and a package contact pad by a solder that melts at a lower temperature than that of the joined metals, said packaging structure comprising, a substrate having a first planar surface and a second planar surface oppositely disposed from said first planar surface, said first planar surface of said substrate containing n arrays of closely spaced contact pads, where n is a positive integer greater than one, said second planar surface of said substrate containing an array of closely spaced package contact pads, passive wiring circuit means contained at least in part in said substrate for interconnecting said contact pads of said n arrays of closely spaced contact pads contained on said first planar surface of said substrate and said closely spaced package contact pads of said array of package contact pads contained on said second planar surface of said substrate, n interconnected integrated circuit chips, each of said n interconnected integrated circuit chips having a first planar surface and a second planar surface oppositely disposed from said first planar surface, each of said n interconnected integrated circuit chips having an array of chip contact pads on said first planar surface thereof, said array of chip contact pads of each of said n interconnected integrated circuit chips respectively corresponding to and electrically connected to one of said n arrays of contact pads contained on said first planar surface of said substrate, each of said n arrays of chip contact pads providing electrical contact to the integrated circuits contained on the chip corresponding thereto, and each of said package contact pads, except at least one, of said array of closely spaced package contact pads having a connector pin brazed thereto by a brazed joint, said method comprising the following steps:

(a) placing said packaging structure with said array of closely spaced connector pins extending in an upward direction in a fixture movable in first and second orthogonal directions within a plane;

(b) moving said fixture containing said packaging structure to accurately position a package contact pad requiring a brazed connector pin under a controllable connector pin insertion mechanism, said connector pin to be inserted having a length of approximately 0.090 inches (2.28 mm.), a diameter of approximately 0.013 inches (0.33 mm.), said connector pin to be inserted being equally spaced from adjacent connector pins contained in said array by approximately 0.100 inches (2.52 mm.), said controllable connector pin insertion mechanism being moveable up and down in a direction perpendicular to the second planar surface of said substrate containing said array of closely spaced connector pins brazed thereto, said controllable pin insertion mechanism having a pin holding means for holding a pin to be inserted in said array, said pin holding means holding said pin with a predetermined force above the contact pad to which said pin is to be brazed;

(c) lowering the controllable connector pin insertion mechanism and the pin holding means, said pin holding means encompassing an upper portion of said pin and magnetically holding said pin to be inserted in said array, said controllable connector pin mechanism and said pin holding means being lowered to a position where the exposed lower end of the connector pin to be inserted in the array and brazed to the package contact pad is in physical contact with the package contact pad;

(d) subjecting said controllable connector pin insertion mechanism including said pin holding means containing said pin to be inserted to a relatively constant fixed downward force of predetermined magnitude, said force being in the direction of said package contact pad;

(e) utilizing first and second elongated oppositely disposed hot gas nozzles each having a section removed at the end next to said pin holding means, placing the nozzles close to the brazed joint of the connector pin and brazing material to be inserted, and said nozzles being in between adjacent connector pins, each of said nozzle having an axis making an acute angle with the axis of the connector pin to be inserted, subjecting said braised joint to first and second beam-like streams of Nitrogen gas at a temperature of approximately 550° C. and each stream having a flow rate of approximately 16.5 SCFH;

(f) after the brazed material has reached the reflow temperature thereof, terminating the stream of heated gas; and (g) a predetermined time after the stream of heated gas has been terminated, removing the downward force on the pin insertion mechanism, and raising the controllable pin insertion mechanism whereby a connector pin has been inserted in the array of connector pins and the inserted connector pin has been brazed to a package contact pad.

7. A method for inserting and brazing a connector pin in an array of closed spaced connector pins contained in an integrated circuit package structure, said array of closely spaced connector pins including in order of 1800, or more connector pins, each of said connector pins having a shank portion having diameter in the order of 0.013 inches (0.33 mm) and a head portion, each of said connector pins having an overall length in the order of 0.090 inches (2.28 mm) each of said connector pins being equally spaced 0.100 inches (2.52 mm.) from adjacent connector pins contained in said array, said packaging structure comprising, a multi-layer ceramic (MLC) substrate having a first planar surface and a second planar surface oppositely disposed from said first planar surface, said first planar surface of said MLC substrate containing n arrays of closely spaced contact pads, where n is an positive integer greater than one, said second planar surface of said MLC substrate containing an array of closely spaced package contact pads, passive wiring circuit means contained at least in part in said MLC substrate for interconnectng said contact pads of said n arrays of contact pads contained on said first planar surface of said substrate and said package contact pads of said array of package contact pads contained on said second planar surface of said substrate, n interconnected integrated circuit chips, each of said n interconnected integrated circuit chips having a first planar surface and a second planar surface oppositely disposed from said first planar surface, each of said n interconnected integrated circuit chips having an array of chip contact pads on said first planar surface thereof, said array of chip contact pads of each of said n interconnected integrated circuit chips respectively corresponding to and electrically connected to one of said n arrays of contact pads contained on said first planar surface of said MLC substrate, each of said n arrays of chip contact pads providing electrical contact to the integrated circuits contained on the chip connected thereto, and each of said package contact pads of said array of closely spaced package contact pads, except at least one, having a connector pin brazed thereto by a brazed joint, said method comprising the following steps:

(a) placing said packaging structure with said array of closely spaced connector pins extending in an upward direction in a fixture, said fixture being movable in first and second orthogonal directions within a plane;

(b) moving said fixture containing said packaging structure to accurately position a package contact pad requiring a brazed connector pin, under a controllable connector pin insertion mechanism, said controllable connector pin insertion mechanism being moveable up and down in a direction perpendicular to the second planar surface of said substrate containing said array of closely spaced connector pins brazed thereto, said controllable connector pin insertion mechanism having a pin holding means, said pin holding means holding a pin to be inserted in said array, said pin holding means holding said pin with a predetermined force above the package contact pad to which said pin is to be brazed;

(c) lowering the controllable connector pin insertion mechanism and the pin holding means to a position where the exposed lower end of the connector pin to be inserted in the array and brazed to the package contact pad is in physical contact with the package contact pad;

(d) subjecting said controllable connector pin insertion mechanism including said pin holding means containing said pin to be inserted to a relatively constant fixed downward force of predetermined magnitude, said force being in the direction of said package contact pad;

(e) utilizing a hot gas nozzle having a section removed at the end next to said pin holding means, placing the nozzle close to the connector pin to be inserted and in between adjacent connector pins subjecting the lower portion of said connector pin to be brazed to said package contact pad to a controlled stream of heated gas, whereby when the nonferrous alloy of the brazed material reaches the reflow temperature thereof the lower end of the connector pin to be inserted and the package contact pad to which it is to be brazed will be encompassed by the braze material;

(f) after the brazed material has closely approached, or reached the reflow temperature thereof terminating the stream of heated gas;

(g) a predetermined time after the stream of heated gas has been terminated, releasing the downward force on the pin insertion mechanism and raising the controllable pin insertion mechanism whereby a connector pin has been inserted in the array of connector pins and the inserted connector pin has been brazed to a package contact pad.

8. A method for inserting and brazing a connector pin in an array of closely spaced connector pins contained in an integrated circuit package structure, said array of closely spaced connector pins including in order of 1800, or more connector pins, each of said connector pins having a shank portion having diameter in the order of 0.013 inches (0.33 mm) and a head portion, each of said connector pins having an overall length in the order of 0.090 inches (2.28 mm) each of said connector pins being equally spaced 0.100 inches (2.52 mm.) from adjacent connector pins contained in said array, said method as recited in claim 10 wherein step (f) of claim 7 is further characterized as follows;

(f') utilizing first and second elongated oppositely disposed hot gas nozzles each having a section removed at the end next to said pin holding means, and placing the nozzles close to the brazed joint of the connector pin and brazing material to be inserted, and the nozzles being in between adjacent connector pins, each of said nozzles having an axis making an acute angle with the axis of the connector pin to be inserted, said orifice of each of said nozzles extending, at least in part, parallel to the axis of the connector pin to be inserted, simultaneously subjecting said brazed joint to first and second beam-like streams of Nitrogen gas at a temperature of approximately 550° C. and each stream of Nitrogen having a flow rate of approximately 16.5 SCFH.

9. A method for inserting and brazing a connector pin in an array of closely spaced connector pins contained in an integrated circuit package structure, said array of closely spaced connector pins including in order of 1800, or more connector pins, each of said connector pins having a shank portion having diameter in the order of 0.013 inches (0.33 mm) and a head portion, each of said connector pins having an overall length in the order of 0.090 inches (2.28 mm) each of said connector pins being equally spaced 0.100 inches (2.52 mm.) from adjacent connector pins contained in said array said method as recited in claim 8, wherein steps (b) and (c) of claim 8, are further characterized as follows;

(b) utilizing said fixture containing said packaging structure accurately align a package contact pad requiring a connector pin to be brazed thereto, under said controllable connector pin insertion mechanism, said controllable connector pin insertion mechanism being moveable up and down in a direction perpendicular to said package contact pad requiring a connector pin to be brazed thereto, said controllable pin insertion mechanism having a pin holding means for holding a pin to be inserted in said array, said pin holding means holding said shank portion end of the pin with a predetermined force above the contact pad to which said pin is to be brazed;

(c) lowering the controllable connector pin insertion mechanism and the pin holding means, said pin holding means encompassing the shank portion end of said pin and magnetically holding said pin to be inserted in said array, said controllable connector pin mechanism and said pin holding means being lowered to a position where the exposed head portion end of the connector pin to be inserted in the array and brazed to the package contact pad is in physical contact with the package contact pad.

10. An apparatus for inserting and brazing a connector pin in an array of closely spaced connector pins contained in an integrated circuit packaging structure, where each of said connector pins in said array is brazed to a package contact pad by a brazed joint, and said connector pin to be inserted in said array is to be brazed to a package contact pad in said array by a brazed joint, where a brazed joint is defined as the mechanical and electrical joining of a connector pin and a package contact pad by a solder that melts at a lower temperature than that of the joined metals, said apparatus comprising:
a fixture for holding said packaging structure with said array of connector pins extending in an upward direction said fixture being movable within an x-y plane;
a controllable connector pin insertion mechanism super imposed over said fixture containing said array of connector pins extending in an upward direction, said controllable connector pin insertion mechanism being moveable toward and away said fixture holding said packaging structure, said controllable connector pin insertion mechanism including controllable pin holding means holding said connector pin to be inserted, said controllable pin holding means holding said pin to be inserted with a predetermined force;
at least one nozzle having a section removed at the end next to said pin insertion mechanism, and said at least one nozzle being close to said pin holding means and moveable between adjacent connecting pins for directing a heated stream of gas at the lower portion of the connector pin to be inserted in said array, said nozzle having an orifice adjacently spaced from said lower portion of said connector pin to be inserted in said array, said nozzle being connected to a regulated heated gas source having an "on/off" control;
means for moving said fixture containing said packaging structure to accurately position a predetermined package contact pad beneath said pin insertion means holding said connector pin to be inserted in said array, said predetermined package contact pad being the package contact pad to which said connector pin to be inserted in the array is to be brazed;
means for lowering said controllable connector pin insertion mechanism with said controllable pin holding means holding said connector pin to a predetermined accurately aligned position over said package contact pad whereby the exposed lower end of the connector pin to be inserted in the array and brazed to the package contact pad is in physical contact with the package contact pad;
means for applying, via said controllable connector pin insertion mechanism and controllable pin holding means, a compression (pushing) force of predetermined magnitude on said connector pin to be inserted whereby said exposed lower end of said connector pin is forced against the package contact pad to which it is to be brazed; and
gas control means for turning "on" said regulated heated gas source for a first predetermined time to cause the solder of the to be formed brazed joint to reach the reflow temperature thereof,
whereby after a second predetermined time period the solder will have solidified and the connector pin to be inserted in the array will be fastened to its package contact pad by a brazed joint.

11. An apparatus for removing an electrically defective connector pin having a brazed joint where a brazed joint is defined as the mechanical and electrical joining of a connector pin and a package contact pad by a solder that melts at a lower temperature than that of the joined metals, and where said electrically defective pin may be any one of a plurality of connector pins arranged in an array of closely spaced connector pins contained in an integrated circuit package structure, said packaging structure comprising,
a substrate having a first planar surface and a second planar surface oppositely disposed from said first planar surface, said first planar surface of said substrate containing n arrays of closely spaced contact pads, where n is a positive integer greater than one, said second planar surface of said substrate containing an array of closely spaced package contact pads,
passive wiring circuit means contained at least in part in said substrate for interconnecting said contact pads of said n arrays of closely spaced chip contact pads contained on said first planar surface of said substrate and said package contact pads of said array of package contact pads contained on said second planar surface of said substrate,
n interconnected integrated circuit chips, each of said n interconnected integrated circuit chips having a first planar surface and a second planar surface oppositely disposed from said first planar surface, each of said n interconnected integrated circuit chips having an array of chip contact pads on said first planar surface thereof, said array of chip contact pads of each of said n interconnected integrated circuit chips respectively corresponding to and electrically connected to one of said n array of contact pads contained on said first planar surface of said substrate, each of said n arrays of chip contact pads providing electrical contact to the integrated circuits contained on the chip connected thereto, and
each of said package contact pads of said array of closely spaced package contact pads having a connector pin brazed thereto by a brazed joint,
said apparatus comprising:
a fixture for holding said packaging structure with said array of connector pins extending in an upward direction, said fixture being movable within an x-y plane;
a controllable connector pin gripper mechanism super imposed over said fixture containing said array of connector pins extending in an upward direction, said controllable connector pin gripper means being moveable toward and away said fixture holding said packaging structure, said controllable connector pin gripper mechanism including controllable pin gripper means for gripping said connector pin to be removed, said controllable pin gripper means having an "open state" and a "closed state" for gripping said connector pin to be removed;

a nozzle having a section removed at the end next to said pin gripper means, and said nozzle being close to the pin gripper means and moveable between adjacent connector pins for directing a heated stream of gas at the lower portion of the connector pin to be removed, said nozzle having an orifice adjacently spaced from said lower portion of said connector pin to be removed, said nozzle being connected to a regulated heated gas source having an "on/off" control;

means for moving said fixture containing said packaging structure to accurately position said connector pin to be removed beneath said pin gripper means;

means for lowering said controllable connector pin mechanism with said controllable pin gripper means in the open state to a predetermined accurately aligned position over said connector pin to be removed, said controllable pin gripper means in the "open state" and in said predetermined lower position at least partially encompassing said upper portion of said pin to be removed;

means for causing said controllable pin gripper means to assume the "closed state" whereby said controllable pin gripper means physically grips said connector pin to be removed;

means for applying, via said controllable connector pin mechanism and controllable pin gripper means, a tensile (pulling) force of predetermined magnitude on said connector pin to be removed; and control means for turning "on" said regulated heated gas source for a predetermined time, whereby, when the solder of the brazed joint of the connector pin to be removed reaches or closely approaches the reflow temperature of the solder, the connector pin to be removed will be separated from its package contact pad.

* * * * *

UNITED STATES PATENT AND TRADEMARK OFFICE
CERTIFICATE OF CORRECTION

PATENT NO. : 4,632,294

DATED : December 30, 1986

INVENTOR(S) : William O. Druschel, et al

It is certified that error appears in the above-identified patent and that said Letters Patent is hereby corrected as shown below:

The title page should be deleted to appear as per attached title page.

Signed and Sealed this

Tenth Day of November, 1987

Attest:

Attesting Officer

DONALD J. QUIGG

Commissioner of Patents and Trademarks

United States Patent [19]

Druschel et al.

[11] Patent Number: 4,632,294
[45] Date of Patent: Dec. 30, 1986

[54] PROCESS AND APPARATUS FOR INDIVIDUAL PIN REPAIR IN A DENSE ARRAY OF CONNECTOR PINS OF AN ELECTRONIC PACKAGING STRUCTURE

[75] Inventors: William O. Druschel, Granite Springs; Alexander Kostenko, Hopewell Junction; Rolf G. Meinert, Wappingers Falls, all of N.Y.

[73] Assignee: International Business Machines Corporation, Armonk, N.Y.

[21] Appl. No.: 684,823
[22] Filed: Dec. 20, 1984
[51] Int. Cl.⁴ ............................................. B23K 31/00
[52] U.S. Cl. ................................... 228/119; 228/264
[58] Field of Search .................. 228/19, 20, 21, 119, 228/264, 240, 242, 180.1, 180.2; 294/65.5

[56] References Cited

U.S. PATENT DOCUMENTS

| | | | |
|---|---|---|---|
| 3,283,124 | 11/1966 | Kawecki | 219/347 |
| 3,374,531 | 3/1968 | Bruce | 29/498 |
| 3,429,040 | 2/1969 | Miller | 29/626 |
| 3,469,061 | 9/1969 | Costello | 219/85 |
| 3,517,278 | 6/1970 | Hager | 317/234 |
| 3,586,813 | 6/1971 | Cruickshank | 219/85 |
| 3,653,572 | 4/1972 | Dushkes | 228/20 |
| 3,710,069 | 1/1973 | Papadopoulos | 219/85 |
| 3,735,911 | 5/1973 | Ward | 228/19 |
| 3,751,799 | 8/1973 | Reynolds | 29/754 |
| 3,895,214 | 7/1975 | Winter | 228/19 |
| 3,993,123 | 11/1976 | Chu | 165/80 |
| 4,066,204 | 1/1978 | Wirbser | 228/264 |
| 4,138,692 | 2/1979 | Meeker | 357/76 |
| 4,160,893 | 7/1979 | Meyen | 219/85 |
| 4,245,273 | 1/1981 | Feinberg | 361/382 |
| 4,270,260 | 6/1981 | Krueger | 29/403 |
| 4,295,596 | 10/1981 | Doten et al. | 228/264 |
| 4,302,625 | 11/1981 | Hetherington | 174/68 |
| 4,366,925 | 1/1983 | Janene | 228/20 |
| 4,418,857 | 12/1983 | Ainslie et al. | 228/180.2 |
| 4,444,559 | 4/1984 | Schink | 432/226 |

FOREIGN PATENT DOCUMENTS

| | | | |
|---|---|---|---|
| 2910066 | 9/1980 | Fed. Rep. of Germany | 228/242 |
| 2925347 | 1/1981 | Fed. Rep. of Germany | 228/264 |
| 918090 | 4/1982 | U.S.S.R. | 294/65.5 |

OTHER PUBLICATIONS

"Extraction Tool", by A. W. Northrop & S. J. Yevchak, IBM Technical Disclosure Bulletin Publication, vol. 3, No. 5, Oct. 1960, p. 8.

"Chip Removal by Hot Gas", by C. R. Tickner, IBM Technical Disclosure Bulletin Publication, vol. 11, No. 7, Dec. 1968, p. 875.

"Circuit Board Module Replacement Tool", by A. S. Baweja & H. P. Carl, IBM Technical Disclosure Bulletin Publication, vol. 13, No. 7, Dec. 1970, p. 2107.

"Pinning Technique for Ceramic Module", by J. R. Lynch, IBM Technical Disclosure Bulletin Publication, vol. 14, No. 1, Jun. 1971, p. 174.

"Integrated Circuit Device Recovery and Restoration Technique", by P. A. Totta, IBM Technical Disclosure Bulletin Publication, vol. 17, No. 1, Jun. 1974, p. 113.

"Low-Temperature Soldered Component Removal", by W. C. Ward, IBM Technical Disclosure Bulletin Publication, vol. 19, No. 7, Dec. 1976, p. 2476.

"Use of a Heated Gas Jet to Remove a Silicon Chip Soldered to a Substrate", by K. S. Sachar & T. A. Sedgwick, IBM Technical Disclosure Bulletin Publication, vol. 20, No. 9, Feb. 1978, p. 3725.

"Inverted Hot Gas Selected Chip Removal", by L. R. Cutting & R. E. Darrow, IBM Technical Disclosure Bulletin Publication, vol. 21, No. 9, Feb. 1979, p. 3592.

"Pin Repair Reflow Capillary", by J. J. Dankelman, H. R. Poweleit, R. J. Seeger and C. G. Smith, IBM Technical Disclosure Bulletin Publication, vol. 22, No. 2, Jul. 1979, p. 565.

"Psuedo-Brewster Angle of Incidence for Joining or Removing a Chip by Laser Beam", by J. C. Chastang, M. Levanoni & S. I. Tan, IBM Technical Disclosure Bulletin Publication, vol. 23, No. 11, Apr. 1981, p. 5194.

*Primary Examiner*—M. Jordan
*Attorney, Agent, or Firm*—Wesley DeBruin

[57] ABSTRACT

The disclosure is directed to process and apparatus for the removal, site preparation, and replacement of any single connector pin contained within a sizeable array of closely spaced very small connector pins on an electronic packaging structure (substrate or module) without causing deleterious metallurgical effects either to the remaining pins or the ceramic substrate.

11 Claims, 19 Drawing Figures